(12) United States Patent
Chen

(10) Patent No.: US 7,651,766 B2
(45) Date of Patent: Jan. 26, 2010

(54) CARBON NANOTUBE REINFORCED METAL COMPOSITES

(75) Inventor: Quanfang Chen, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 11/437,180

(22) Filed: May 19, 2006

(65) Prior Publication Data

US 2007/0036978 A1 Feb. 15, 2007

Related U.S. Application Data

(60) Provisional application No. 60/683,227, filed on May 20, 2005.

(51) Int. Cl.
*D02G 3/00* (2006.01)
*B32B 9/00* (2006.01)

(52) U.S. Cl. ............... 428/367; 428/364; 977/742; 977/778; 977/784; 977/833

(58) Field of Classification Search .......... 257/766; 977/742, 842, 778, 784, 833; 428/364, 367
See application file for complete search history.

(56) References Cited

U.S. PATENT DOCUMENTS

| | | | | |
|---|---|---|---|---|
| 7,135,773 | B2 * | 11/2006 | Furukawa et al. | 257/758 |
| 7,217,311 | B2 * | 5/2007 | Hong et al. | 75/345 |
| 2002/0098135 | A1 * | 7/2002 | Smalley et al. | 422/198 |
| 2004/0131835 | A1 * | 7/2004 | Schmitt et al. | 428/293.1 |
| 2004/0266065 | A1 * | 12/2004 | Zhang et al. | 438/122 |
| 2006/0263584 | A1 * | 11/2006 | Schulz-Harder et al. | 428/292.1 |

OTHER PUBLICATIONS

Susumu et al., "Carbon Nanofiber-Copper COmposites Fabricated by Electroplating" Electrochemical and Solid State Letters, vol. 7, Issue 3, abstract., 2004.*
Dong et al., "An investigation of the Sliding wear behavior of Cu-matrix Composite reinforced by carbon nanotubes" Materials Science and Engineering A, 313, pp. 83-87, 2001.*
Chen et al. "Carbon Nanotube Composite Deposits with High Hardness and High Wear Resistance" Advanced Eng. Materials. vol. 5, Iss. 7, pp. 514-518. (2003).*
Tu et al. "Tribological Properties of Carbon-Nanotube-Reinforced Copper Composites", Tribology Letters, vol. 10, No. 4, 2001, pp. 225-228.*
Chen et al., "Electrodeposited Nickel Composites Containing Carbon Naotubes", Surface and Coatings Technology, vol. 155, 2002, pp. 274-278.*

(Continued)

*Primary Examiner*—Timothy M Speer
*Assistant Examiner*—Jonathan C Langman
(74) *Attorney, Agent, or Firm*—Patents on Demand, P.A.; Neil R. Jetter

(57) ABSTRACT

A carbon nanotube reinforced metal nanocomposite material includes a continuous metal phase, and a plurality of carbon nanotubes dispersed in the continuous metal phase. The metal phase extends throughout substantially an entire thickness of the nanocomposite material. The nanotubes are preferably single wall nanotubes (SWNTs). Carbon nanotube reinforced metal nanocomposites according to the invention provide thermal conductivity and electrical conductivity which are generally significantly higher than the pure metal continuous phase material, mechanical strength is 2 to 3 times greater than that of the pure metal, and a tailorable coefficient of thermal expansion obtainable through changing the percentage of nanotubes in the nanocomposite.

18 Claims, 6 Drawing Sheets

OTHER PUBLICATIONS

Chen, et al., "Electrochemical synthesis of polypyrrole/carbon nanotube nanoscale composites using well-allinged carbon nanotube arrays", Applied Physics A, 73, 129-131 (2001).

Arai, et al., "Ni-deposited multi-walled carbon nanotubes by electrodeposition", Carbon, 42, 641-644 (2004).

Chen et al. "The Role of Metal-Nanotube Contact in the Performance of Carbon Nanotube Field-Effect Transistors", Nano Letters, (2005), vol. 5, No. 7, pp. 1497-1502.

Kissa, Dispersions Characterizations, Testing and Measurement, ISBN 08247-1994-8, Marcel Dekker, Inc., New York, (1994), p. 1.

Saito "Physical Properties of Carbon Nanotubes", Dresselhaus and M.S. Dresselhaus, (1998), Imperial College Press, pp. 68-69.

Bruan, A., "Thermal Processing Copies with Limits, Materials". Semiconductor International, Apr. 1, 2001. Found on the Internet at: <<http://www.semiconductor.net/index.asp?layout=articlePrint&articleID=CA82787>>.

Yi Feng et al; Fabrication and Properties of Silver-Matrix Composites Reinforced by Carbon Nanotubes; Dept. of Materials Science and Engineering, '2005; pp. 211-218.

Stefan Frank et al; Carbon Nanotube Quantum Resistors; Science, vol. 280, Jun. 12, 1998.

J.E. Fischer et al; Metallic Resistivity in Crystalline Ropes of Single-Wall Carbon Nanotubes; Physical Review, vol. 55, No. 8, Feb. 15, 1997.

* cited by examiner

Fig. 3: (A) Sketch of flow streamline alignment, (B) is an actual SEM picture of aligned SWCNT in the Cu matrix.

Table 1

| Tested electric resistivity of Cu/SWNT composite sample (thickness=22 μm) | | | |
|---|---|---|---|
| Measured point | Restivity (μΩ-cm) | Rs (Ω/□) | V/I (Ω) |
| Point 1 | 1.1858 | 0.000539 | 0.000118 |
| Point 2 | 1.2408 | 0.000564 | 0.000124 |
| Point 3 | 1.2342 | 0.000561 | 0.000123 |
| Average | *1.2203* | *0.000555* | *0.000122* |
| Tested electric resistivity of electroplated pure copper (thickness=10.5 μm) | | | |
| Measured point | Restivity (μΩ-cm) | Rs (Ω/□) | V/I (Ω) |
| Point 1 | 1.6695 | 0.00159 | 0.000352 |
| Point 2 | 1.785 | 0.00170 | 0.000376 |
| Point 3 | 1.7115 | 0.00163 | 0.000360 |
| Average | *1.7220* | *0.00164* | *0.000363* |

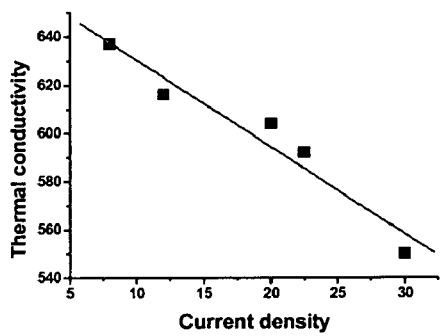
FIG. 5A
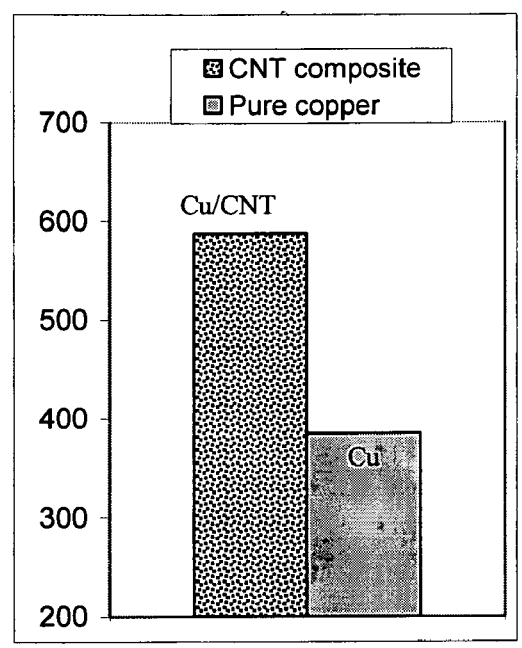
FIG. 5B
FIG. 5

CARBON NANOTUBE REINFORCED METAL COMPOSITES

CROSS-REFERENCE TO RELATED APPLICATIONS

This application claims the benefit of U.S. Provisional Patent Application Ser. No. 60/683,227, entitled "CARBON NANOTUBE REINFORCED METAL COMPOSITES" filed on May 20, 2005, the entirety of which is incorporated herein by reference.

STATEMENT REGARDING FEDERALLY SPONSORED RESEARCH OR DEVELOPMENT

Not applicable.

FIELD OF THE INVENTION

The present invention relates to carbon nanotube reinforced metal composite materials and methods for making the same.

BACKGROUND OF THE INVENTION

There is a never ending search for improved materials. Many of these improved materials are composite materials. Composites are formed when various distinct materials are engineered together to create a new material. The idea is to take best advantage of the strengths of each component material, while minimizing their weaknesses. Composites may be engineered with unique physical properties to suit very distinct applications.

Carbon nanotubes composites have recently received a lot of attention. A carbon nanotube is essentially a graphite sheet folded into a tubular shape. This structure retains the mechanical strength of the sheet axial (in-plane) to the orientation of the tube, but is weak in the lateral direction. Carbon nanotubes also provide high in-plane electrical conductivity as well as high in-plane thermal conductivity. Recent efforts in forming carbon nanotube composites generally disclose blending nanotubes into a polymer matrix, much like a fiberglass composite.

SUMMARY OF THE INVENTION

The present invention is a carbon nanotube reinforced metal nanocomposite material which comprises a continuous metal phase, and a plurality of carbon nanotubes dispersed in the continuous metal phase. The metal phase extends throughout substantially an entire thickness of the nanocomposite material. As used herein, the phrase "throughout substantially an entire thickness of the nanocomposite material" refers to at least the majority (51%) of the volume of the nanocomposite material including metal or metal alloy. In a preferred embodiment, essentially the entire volume of the bulk material (e.g. at least 95%, such as >99%) includes the metal. Carbon nanotube reinforced metal nanocomposites according to the invention provide thermal conductivity and electrical conductivity which are both generally significantly higher than the pure metal continuous phase material, and a tailorable coefficient of thermal expansion obtainable through changing the percentage of nanotubes in the nanocomposite. Moreover, the mechanical strength of metal nanocomposites according to the invention have been found to be generally at least 2 to 3 times higher as compared to the pure metal or metal alloy material. Therefore, nanocomposites according to the invention are multifunctional.

Parameters of nanocomposites according to the invention are all generally isotropic, including, but not limited to thermal conductivity, electrical conductivity, coefficient of thermal expansion, and mechanical strength. However, anisotropic parameters can be obtained using the invention, such as in the case of nanocomposites fabricated with aligned carbon nanotubes, or those of single/bundle carbon nanotube coated with a metal layer.

In a preferred embodiment, at least a portion of the plurality of nanotubes is in physical contact. The continuous metal phase generally comprises copper, silver, cobalt, chromium, tungsten nickel or gold, or metal alloys including these metals.

Preferably, the continuous metal phase comprises copper. In the copper embodiment, the carbon nanotube reinforced metal nanocomposite material provides a 25° C. electrical conductivity and bulk thermal conductivity that are both at least 20% greater than pure copper. The carbon nanotube reinforced Cu nanocomposite material can provide a coefficient of thermal expansion in the range from 3 to $6 \times 10^{-6}$/K in the temperature range from 25 to 150° C.

The carbon nanotube comprising layer preferably consists essentially of single wall nanotubes (SWNTs). The volume fraction of the plurality of carbon nanotubes is generally from 0.1 to 60% of the nanocomposite, such as 0.5%, 1%, 5%, 10%, 15%, 20%, 25%, 30%, 35%, 40%, 45%, 50%, or 55%. In a preferred embodiment of the invention, the volume fraction of carbon nanotubes comprises 5% to 30% of the nanocomposite. In one embodiment, the carbon nanotubes are preferentially aligned in the composite in a direction generally orthogonal to a direction of the thickness of the nanocomposite.

An article according to the invention comprises a base semiconducting layer, and a carbon nanotube reinforced metal nanocomposite layer disposed on the base layer. The nanocomposite layer comprises a continuous metal or metal alloy phase, and a plurality of carbon nanotubes dispersed in the continuous metal phase, where the metal phase extends throughout substantially an entire thickness of the nanocomposite material. A coefficient of thermal expansion of the nanocomposite layer can be within 30% of a coefficient of thermal expansion of the base semiconducting layer in the temperature range from 25 to 150° C. In a preferred embodiment, the metal comprises copper.

In an alternate embodiment, single carbon nanotubes can be coated with a metal or metal alloy. Such structures can be used, for example, as nanoscale interconnects for future ICs.

BRIEF DESCRIPTION OF THE DRAWINGS

A fuller understanding of the present invention and the features and benefits thereof will be obtained upon review of the following detailed description together with the accompanying drawings, in which:

FIG. 3(A) is a sketch of SWNTs preferentially aligned in a particular direction in a Cu comprising electrolyte solution while FIG. 3(B) is a scanned SEM photograph which shows a nanocomposite according to the invention in which SWNTs are preferentially aligned in a particular direction in a Cu comprising continuous phase (matrix), thus demonstrating that carbon nanotubes can be aligned within a metal matrix.

FIG. 5(A) shows the measured room temperature bulk thermal conductivity for an exemplary electroformed SWNT/Cu nanocomposite versus the deposition current density (mA/cm$^2$) used to form the SWNT/Cu nanocomposite. FIG. 5(B) shows the bulk thermal conductivity of a SWNT/Cu nanocomposite according to the invention as compared to the bulk thermal conductivity of pure copper (385 W/m·K).

DETAILED DESCRIPTION OF THE INVENTION

The present invention is more particularly described in the following description and examples that are intended to be illustrative only since numerous modifications and variations therein will be apparent to those skilled in the art. As used in the specification and in the claims, the singular form "a," "an," and "the" may include plural referents unless the context clearly dictates otherwise. Also, as used in the specification and in the claims, the term "comprising" may include the embodiments "consisting of" and "consisting essentially of".

A carbon nanotube reinforced metal nanocomposite material according to the invention comprises a continuous metal phase, and a plurality of carbon nanotubes dispersed in the continuous metal phase. The metal phase extends throughout substantially an entire thickness of the nanocomposite material. The plurality of carbon nanotubes are generally uniformly covered by the continuous metal phase. In one embodiment, the carbon nanotubes are preferentially aligned in the continuous metal phase, such as generally along a given direction. The nanocomposite is generally exclusive of any material other than the metal or metal alloy and the nanotubes.

Carbon nanotube reinforced metal nanocomposites according to the invention provide thermal conductivity, electrical conductivity and tensile strength all generally significantly higher than the pure metal continuous phase material. In addition, carbon nanotube reinforced metal nanocomposites according to the invention provide tailorable coefficient of thermal expansion (CTE) through variation of the composition, which can be designed to match the CTE for a variety of materials of interest, including most semiconductors and electrically insulating (dielectric) substrates.

Carbon nanotube reinforced metal nanocomposites according to the invention are preferably formed using an electrochemical co-deposition process in which both the nanotubes and the metal ions to be electrodeposited are in an electrolyte comprising solution. This process advantageously can be performed at or near room temperature, such as less than or equal to about 50° C., and is thus compatible with a wide variety of processes and associated materials. An exemplary process capable of being scaled for large area substrates and deposition on multiple substrates simultaneously is provided in the Examples.

Figure 1:
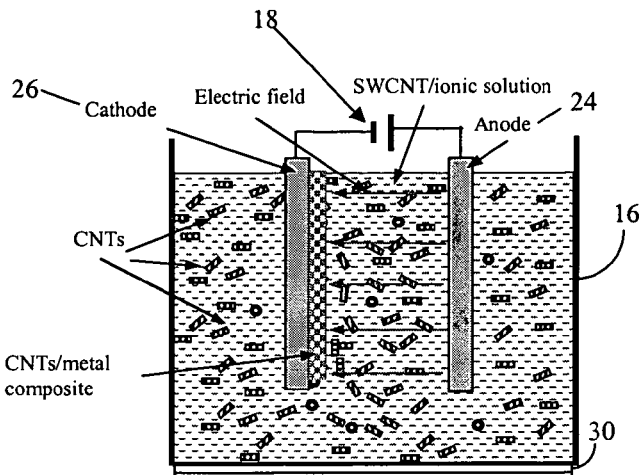
FIG. 1 shows a schematic of an exemplary electrochemical co-deposition apparatus for forming nanocomposites according to the invention.

Referring now to FIG. 1, a schematic representation of an exemplary electrochemical co-deposition apparatus for producing the carbon nanotube nancomposites according to the invention is shown. As noted above, electrodeposition can be performed at low temperatures, and is thus the electrodeposition method is highly versatile. For example, electro co-deposition according to the invention can be integrated with many integrated circuit fabrication processes including damascene processes used in state-of-the-art IC fabrication processes to form electrically conductive interconnects and other electrically conductive layers (e.g. contacts and/or metal gates). Another advantage of the electrochemical co-deposition process is that carbon nanotubes are not measurably degraded by the inventive co-deposition process and better interfacial bonding is obtained, due to the low temperature and better wetting characteristics.

Carbon nanotubes, a source of metal ions (e.g. metal salt), and an electrolyte solution are provided in reaction vessel 16, which is generally made of glass or ceramic. A power supply 18 with an ammeter and voltmeter (not shown) is connected between the anode 24 and cathode 26. The CNT metal nanocomposite is shown forming on the cathode 26. Agitation of the liquid is preferably provided by a magnetic stirrer 28 separated from the liquid by a spacer 30. A reference electrode (not shown) is preferably provided to monitor the electrochemical activity.

In a preferred embodiment, the carbon nanotubes are pre-treated with one or more surfactants. A variety of surfactants can be used with the invention. The surfactant can be a non-ionic, anionic, cationic or a zwitterionic surfactant. Preferred surfactants are cetyl trimethyl ammonium bromide (CTAB; a cationic specie) and octyl trimethylammonium bromide (OTAB; another cationic specie). This pre-treatment positively charges the carbon nanotubes (CNT) in the electrolyte comprising solution and also limits flocculation of the nanotubes out of the solution. Since the metal ions are generally positively charged as well, the codeposition is realized with metallic ions (such as $Cu^{+2}$) and CNT both electrodepositing at the cathode where they are each electrochemically reduced.

In one inventive embodiment, the electrolyte solution includes $CuSO_4$ as the metal ion source, $H_2SO_4$ as the electrolyte source, SWNTs and CTAB, and other additives for reducing the stress and increasing the brightness. The pH value is generally maintained at a level of 2-5 to provide a high level of nanotube dispersion. The concentration of carbon nanotubes in the electrolyte solution is generally in the range from 0.5% to 80%.

The deposition rate is readily controllable via the current control as monitored by a suitable ammeter. The deposition rate can generally be as low as 1 µm/hour or generally as high as 1 µm/minute.

A variety of anode and cathode materials can be used for the electrochemical co-deposition. For example, the cathode for the codeposition can be selected from metallic substrates, such as copper plate/sheet, other metals or metal alloys such as nickel, cobalt, chromium, tungsten, gold, and alloys/steels. The anode can be a metallic material to be co-deposited such as copper, or a noble and generally chemically inert metal, such as platinum.

Electrically non-conductive or semiconducting materials, such as silicon, silicon dioxide, silicon carbide, can be used as electrodes by depositing a metallic layer (seed layer) thereon. The seed layer is an electrical conductor, such as copper or nickel. Titanium or chromium are exemplary metals that can be used to increase the adhesion between the metallic seed layer and the non-metallic base material.

Copper is generally the preferred metal material for forming the continuous metal phase for most applications due to its high electrical and thermal conductivity, and low cost. The cost of fabrication of nanocomposites according to the invention is expected to be comparable to conventional metal (e.g. Cu) deposition. However, other metallic materials, including but not limited to silver, nickel, gold, or alloys thereof, can be also be used. More generally, any metal providable as a cation in solution and electrochemically reducible can be used. Based alone on electrical and thermal conductivity considerations, silver is generally a good choice as an alternative to copper. Nanocomposites according to the invention can also be based on electrically conductive polymers, such as polypyrrole, polyphenylene and polythiophene, and derivatives thereof.

In a preferred embodiment, the nanotubes in the nanocomposite consist essentially of SWNTs, such as at least 90%, preferably 95%, or more, such as 99%. SWNTs have been found to lead to higher electrical conductivity and tensile strength for the nanocomposite as compared MWNTs. However, when maximum electrical conductivity or tensile strength is not a requirement, MWNTs can be used, or mixtures of SWNTs along with a significant percentage (e.g. >10%) of MWNTs.

The overall amount of carbon nanotubes in the nanocomposite may vary, depending on the selected application. As noted above, the carbon nanotubes generally make up from 0.1 to 60% by volume of the polymer nanocomposite, preferably being about 10 to about 30 vol. %. The nanotube density is about 1.33 g/cm$^3$. Therefore, more carbon nanotubes added would reduce the density of the composite.

The high electrical and thermal conductivity, high tensile strength, and tailorable coefficient of thermal expansion (CTE) makes nanocomposites according to the invention well suited for a variety of applications. Regarding thermal conductivity, thermal conductivity is known to be important in applications requiring dissipation of heat resulting from various applications. As noted above, the thermal conductivity of metal composites according to the invention are significantly higher than the corresponding pure metal or metal alloy. Since the Cu/SWNT composites according to the invention provide very high thermal conductivities, it is generally difficult to measure the thermal conductivity directly due to difficulties in measuring the small temperature drop required precisely enough. The Inventor has developed a micro-electro-mechanical setup to measure the thermal conductivity.

The measured thermal conductivity of an exemplary carbon nanotube reinforced copper composite according to the invention was found to be about 640 W/m·K, or about 66% higher as compared to pure copper. However, significantly higher thermal conductivity from composites according to the invention is expected to be obtainable.

Since the Cu/SWNT can be modeled as a metallic conductor, its thermal conductivity (K) can be determined with the Wiedemann and Franz law copied below, where σ is the electrical conductivity, and T is the temperature in Kelvin:

$$K/\sigma T = L = (\pi^2 k_B^2/3e^2) = 2.45 \times 10^{-8} \text{ W}\cdot\Omega/\text{K}^2 \qquad (1)$$

From the electrical resistivity measured with an exemplary Cu/SWNT composite using four-point probe ($1.22 \times 10^{-6}$ ohm-cm), the electrical conductivity is the reverse (inverse) of it in equation (1).

The effective CTE of Cu/SWNT nanocomposite (or more generally a metal/SWNT composite) can be estimated as follows:

$$\alpha_{com} = (\alpha_{CNT} E_{CNT} V_{CNT} + \alpha_{Cu} E_{Cu} V_{Cu})/(E_{CNT} V_{CNT} + E_{Cu} V_{Cu}) \qquad (2)$$

Where E is the Young's modulus, V is the volume fraction, and α stands for CTE. Since CNT's Young's modulus is very high (about 1 TPa) and the CTE is negative in axial direction ($-1.6 \times 10^{-6}$/K), a tailorable CTE of the CNT/Cu composite can be realized using equation (2). For example, a volume portion of 23% of SWNT is calculated to achieve a CTE for the nanocomposite about the same as the CTE for SiC. Similarly, a volume fraction of 16% is calculated to match the CTE of GaAs ($5.9 \times 10^{-6}$/K).

The high electric conductivity plus matched CTE of the Cu/SWNT nanocomposite with the semiconductor (e.g. Si) has significant potential for power electronics (interconnect, packaging and assembling). Regarding integrated circuits including processors and memory circuits where speed is of high importance, the use of Cu for interconnect layers has already begun to replace Al alloys for 0.18 µm processes, and is expected to become common for 0.13 µm processes and below to permit that attainment of the desired processing speed. Because as noted above Cu/SWNT nanocomposites according to the invention generally provide bulk electrical conductivities of >40% higher as compared to Cu, Cu/SWNT nanocomposites according to the invention are expected to replace Cu for applications for IC interconnect layers which Cu is currently used and was previously planned to be used for performance considerations alone. The improved CTE matching of Cu/SWNT nanocomposites according to the invention as compared to Cu provides another compelling reason to use Cu/SWNT nanocomposites according to the invention instead of Cu.

Applied to MEMS applications, good mechanical properties such as tensile strength and coefficient of thermal expansion are also important. Nanocomposites according to the invention can provide improved thermal management for high power electronics (HPE) where ultra high thermal conductive materials for heat spreader/exchanger to maintain the semiconductor HPE temperature below certain value (e.g. 150° C. for high power amplifiers). Other heat spreader applications include those for high power lasers, high field magnets, and IC circuits, including heat spreaders for semiconductor packages.

Nanocomposites according to the invention also provide high specific thermal conductivity, which is defined as the thermal conductivity divided by the density of the material.

The resulting density of the nanocomposite has been found to largely depend on the volume fraction of carbon nanotube used, as well as the concentration of micro voids in the nanocomposite material. Microvoids form due to gas bubbles generated during the preferred electrochemical process described herein. It is generally desirable to limit the concentration of microvoids. The concentration of microvoids can be limited by controlling the deposition rate, with a lower deposition rate generally leading to a lower density of microvoids. However, in some applications, such as in space applications, where a low density is needed, a high concentration of microvoids may be desirable.

The density of the nanocomposite is generally about 85 to 98% of the density of metal continuous phase material, such as copper. Accordingly, the ratio of the specific thermal conductivity of composites according to the invention to the underlying metal comprising the continuous phase is even higher than the corresponding bulk thermal conductivities. Specific thermal conductivity becomes important when the weight of an article is of importance.

Moreover, the mismatch of the coefficient of thermal expansion (CTE) between most semiconductors (4 to 6× $10^{-6}$/K) and the heat spreaders/exchangers according to the invention can be minimized to a low level. It is expected that composites according to the invention can provide a tailorable CTE to match the semiconductor from about 4 to about 10 ppm/K as needed. The CTE providable by the invention can be compared with the CTE of Cu of about 17 ppm/K. According, composites according to the invention will experience little or no reliability impacting spalling that is known to be experienced by Cu layers on semiconductors.

As noted above, nanocomposites according to the invention can also provide improved metal interconnect layers for integrated circuits. Electro co-deposition can be performed to deposit nanocomposites according to the invention on the wafer surface, such as on patterned damascene wafers on a plurality of wafers at a time. Among the challenges facing microelectronic in the push to greater device densities is electromigration of metal from the metal interconnect. This effect is exacerbated by the increasing electric fields, as individual device dimensions shrink. The ease with which species migration occurs is related to the atomic binding strength of the material. Bonds must be broken and reformed for atomic migration to occur. Carbon atoms comprising the nanotube sidewalls are exceptionally tightly bound, requiring about 7 eV per atom to remove, compared to 1 to 3 eV for elemental metal materials. Moreover, the nanotubes themselves are generally too large to migrate as a whole. Thus, electromigration of the carbon from the nanotubes will be effectively non-existent, thus significantly improving the electromigration resistance of the composites.

Besides interconnects, semiconductor applications for this invention include, but not limited to, packaging such as wafer bumping and leadframes. One exemplary leadframe is the bumped double leadframes for power electronics.

Other applications for the invention will benefit from the high electrical conductivity, high thermal conductivity and/or high mechanical (e.g. tensile) strength provided by composites according to the invention. Other exemplary applications, include, but are not limited to thermal management, such as heat spreaders and heat exchangers, interface materials, spacecraft radiators, electric motors and generators, antennas, avionic enclosures and printed circuit board thermal planes, optoelectronic and microelectromechanical (MEMS) components and subsystems, fuel cells, and medical materials.

EXAMPLES

The present invention is further illustrated by the following specific Examples, which should not be construed as limiting the scope or content of the invention in any way.

Exemplary Process

An exemplary electrolyte composition used to form carbon nanotube reinforced copper composites according to the invention comprised 250 g/L Copper Sulfate Pentahydrate Crystals ($CuSO_4.5H_2O$), 40 mL/L sulfuric acid (concentration of 98%), 0.13 mL/L hydrochloric acid (concentration of 35%), 12.5 mL/L COPPER GLEAM CLX START-UP™, and 2 g/L SWNTs. All the chemicals except the COPPER GLEAM CLX START-UP™ were obtained from Fisher Scientific Inc (Fairlawn, N.J.). The latter was ordered from Think & Tinker, Ltd., (Palmer Lake, Colo.).

First, the SWNTs were dispersed in the copper electrolyte with surfactants. The surfactants including Sodium Dodecyl Sulfate (SDS), Triton X-100™ and Pointe Scientific, Inc. Wetting Agent (Canton, Mich.), CTAB and OTAB were used as dispersants. Ultrasonic stirring was employed to break up the nanotube aggregates. Uniform black dispersed solutions were obtained without stirring. The solutions can generally be kept for several days without aggregation for the maximum concentration of carbon nanotube of about 10 g/L.

Next, electro codeposition was conducted to fabricate the inventive composite using the above-mentioned solution. A square-shaped anode was used for the uniformity coverage opposite to the cathode substrate. The deposition was performed at room temperature and the current density was kept at 10 mA/cm². The deposition rate was about 13 µm/hour. This process is easily scalable to deposit on semiconductor wafers, including large area wafers, and for deposition on multiple such wafers simultaneously.

Figure 2:
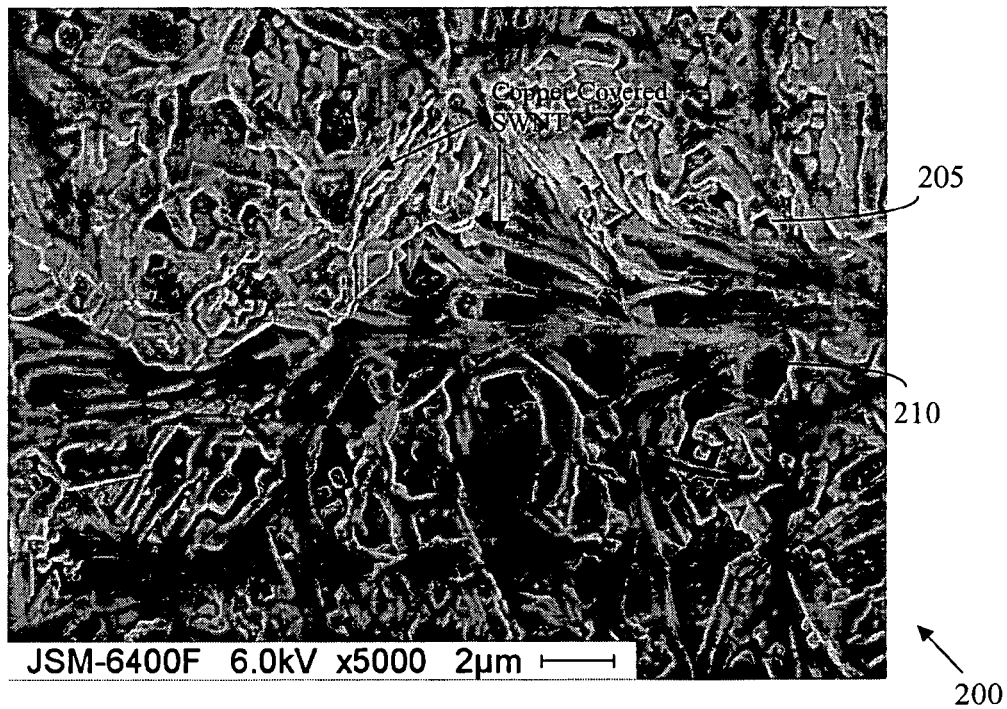
FIG. 2 is a scanned SEM image of an electrochemically co-deposited copper/SWNT nanocomposite. SWNTs can be seen to be covered uniformly by copper that forms the continuous phase shown.

Carbon nanotube reinforced copper nanocomposites were formed using the electro co-deposition process described above. FIG. 2 is a scanned SEM image of an electrochemically co-deposited copper/SWNT nanocomposite 200. SWNTs 205 can be seen to be covered uniformly by copper that forms the continuous phase 210. The SWNTs can be seen to be somewhat aligned in the Cu matrix. The uniformity in coverage with stiff and conductive copper according to the invention better utilizes the properties of the SWNTs, as compared to conventional carbon nanotube polymer composites.

Figure 3:
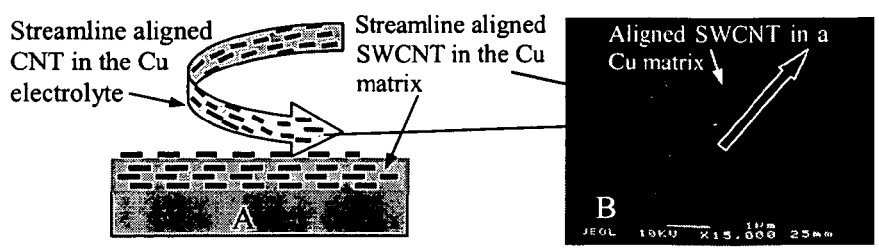

FIG. 3(A) is a sketch of SWNTs preferentially aligned in a particular direction in a Cu comprising electrolyte while FIG. 3(B) is a scanned SEM photograph which shows a nanocomposite according to the invention in which SWNTs are preferentially aligned in a particular direction in a Cu comprising continuous phase (matrix), thus demonstrating that carbon nanotubes can be preferentially aligned within the metal matrix.

Figure 4:
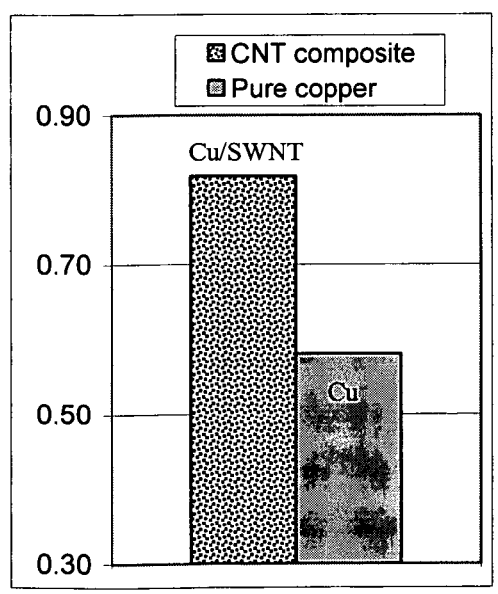
FIG. 4 shows the electrical conductivity ($\times 10^6$ Siemens) measured with a four-point probe on fabricated Cu/SWNT nanocomposite according to the invention and electrochemically deposited copper. The fabricated copper has a standard electrical conductivity (resistivity of $1.72 \times 10^{-6}$ ohm-cm), while the copper coated SWNT composite according to the invention was found to have much higher electrical conductivity as compared to copper (>40%), with a corresponding lower resistivity ($1.22 \times 10^{-6}$ ohm-cm). Table 1 provided shows the raw measured data used to compile the comparative plot provide.

FIG. 4 shows the electrical conductivity (×10⁶ Siemens) measured with a four-point probe at room temperature on fabricated Cu/SWNT nanocomposite according to the invention and electrochemically deposited copper. The SWNT/copper composite was 10 microns thick and fabricated on a silicon wafer. Similarly, a 10 micron copper layer was prepared on different wafer using a otherwise equivalent electrodeposition process for a control. The measured room temperature resistance of the copper control sample was 1.72× $10^{-6}$ ohm-cm, which is equivalent to the published resistivity value for copper, while the copper coated SWNT composite according to the invention was found to have much higher electrical conductivity (40% higher) as compared to copper, with a corresponding lower resistivity (1.22×10⁻⁶ ohm-cm), which is about 60% of the resistivity of pure copper. Table 1 provided shows the raw measured data used to compile the comparative plot provided.

It may be possible to further improve the electrical conductivity of the nanocomposite through improved interfacial bonding and better SWNT alignment during fabrication, as well the effects on electron transport. Nanotubes can be aligned using a flow orientation direction during the electrodeposition process, or by using a magnetic field during electrodeposition to orient the nanotubes which generally become positively charged in the presence of surfactant.

Regarding thermal conductivity, as noted above, since the Cu/SWNT composite is a very good thermal conductor, it is difficult to measure the thermal conductivity directly, due to difficulties in measuring the temperature drop precisely. The measured thermal conductivity of an exemplary carbon nanotube/Cu composite according to the invention was found to be about 640 W/m·K, which is about 66% better than that of pure copper. Moreover, the thermal conductivity can be estimated by the Wiedemann and Franz's law (Equation 1 above). Using the electrical resistivity of the Cu/SWNT composite using a four-point probe (1.22×10⁻⁶ ohm-cm), the thermal conductivity is the reverse of it in the equation (1). The calculated thermal conductivity (K) of the nanocomposite using equation 1 is calculated to be 588 W/m·K. This value of thermal conductivity (K) for the nanocomposite is 53% greater than the thermal conductivity (K) of pure copper (385 W/m·K) as shown in FIG. 5(B).

It was found that thermal conductivity is a function of deposition current density (mA/cm²) used to form the SWNT/Cu nanocomposite FIG. 5(A) shows the measured room temperature bulk thermal conductivity for an exemplary electroformed SWNT/Cu nanocomposite versus the deposition current density (mA/cm²) used to form the SWNT/Cu nanocomposite. As the deposition current density is increased, the thermal conductivity is seen to increase in a nearly linear fashion.

Regarding mechanical characterizations, strength, toughness and coefficient of thermal expansion (CTE) are important properties for multifunctional materials. As noted above, CTE is important for thermal and electrical application in high power electronics (HPE) and VLSIC, as well as in high magnetic fields, due to the effect of mismatch of CTE between conductors and other substrates. For example, the CTE of copper is very high (17.0×10⁻⁶/K) and semiconductor's CTE is much smaller (SiC~3.8×10⁻⁶/K, GaAs~5.9×10⁻⁶/K). The effort in developing a CuMo alloy to reduce the CTE (CTE 5.8×10⁻⁶/K) to the same order of semiconductors has resulted substantial decreased the thermal conductivity (181 W/m·K). Therefore, materials with matched CTE and high thermal and electrical conductivity are needed.

Figure 6:
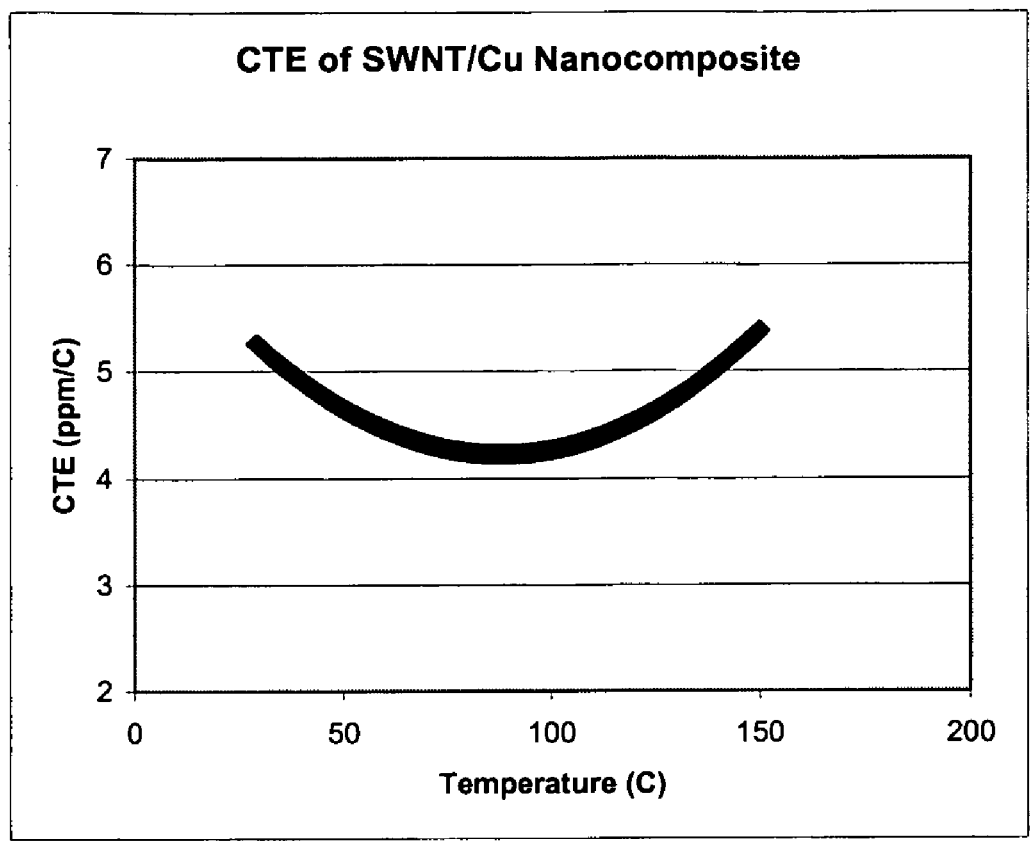
FIG. 6 shows the thermal expansion coefficient (CTE) of a SWNT/Cu nanocomposite according to the invention versus temperature. The CTE for the SWNT/Cu nanocomposite is about 4 times less as compared to pure copper.

Experimental results regarding the effective CTE (in ppm/° C.) for an exemplary Cu/SWNT (volume portion of SWNT of about 18%) nanocomposite is shown in FIG. 6. The effective CTE is about 4 to 5×10⁻⁶/K in the temperature range of 25° C. to 120° C. This is about 4 times smaller as compared to the CTE of copper. This effective CTE matches the CTE of most commonly used semiconducting and some insulating (dielectric) substrates.

Figure 7:
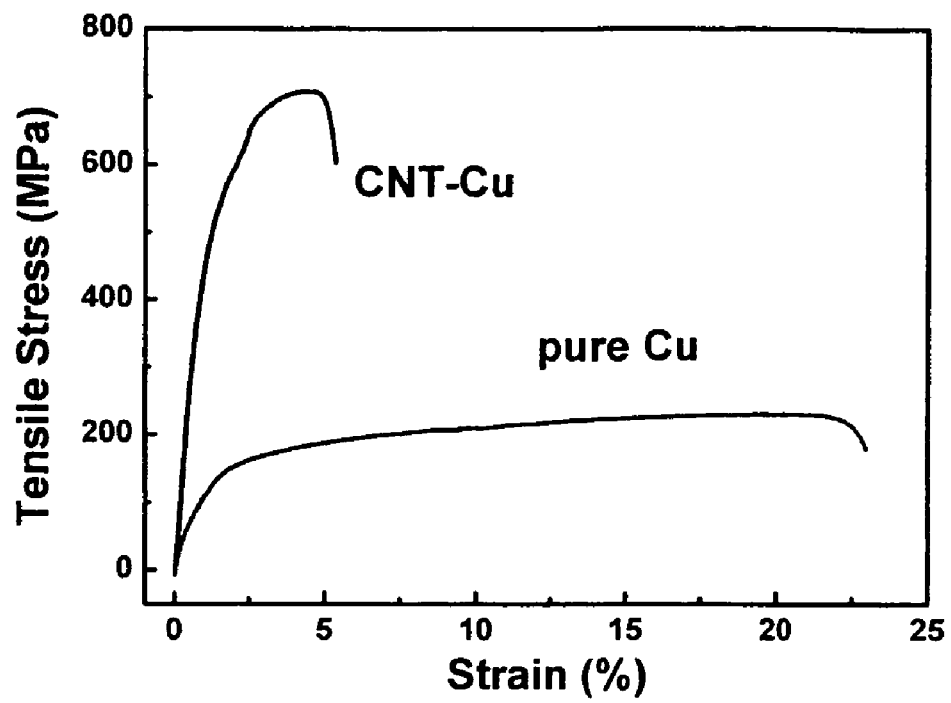
FIG. 7 is plot which compares the tensile strength provided by electrodeposition of pure copper as compared to electrodeposition of carbon nanotube reinforced copper composite according to the invention. The tensile strength is shown increased by an order of magnitude by the carbon nanotube reinforced copper composite according to the invention.

FIG. 7 is plot which compares the tensile strength provided by electrodeposition of pure copper as compared to electrodeposition of a carbon nanotube reinforced copper composite according to the invention. The tensile strength is shown increased by an order of magnitude by the carbon nanotube reinforced copper composite according to the invention.

Figure 8:
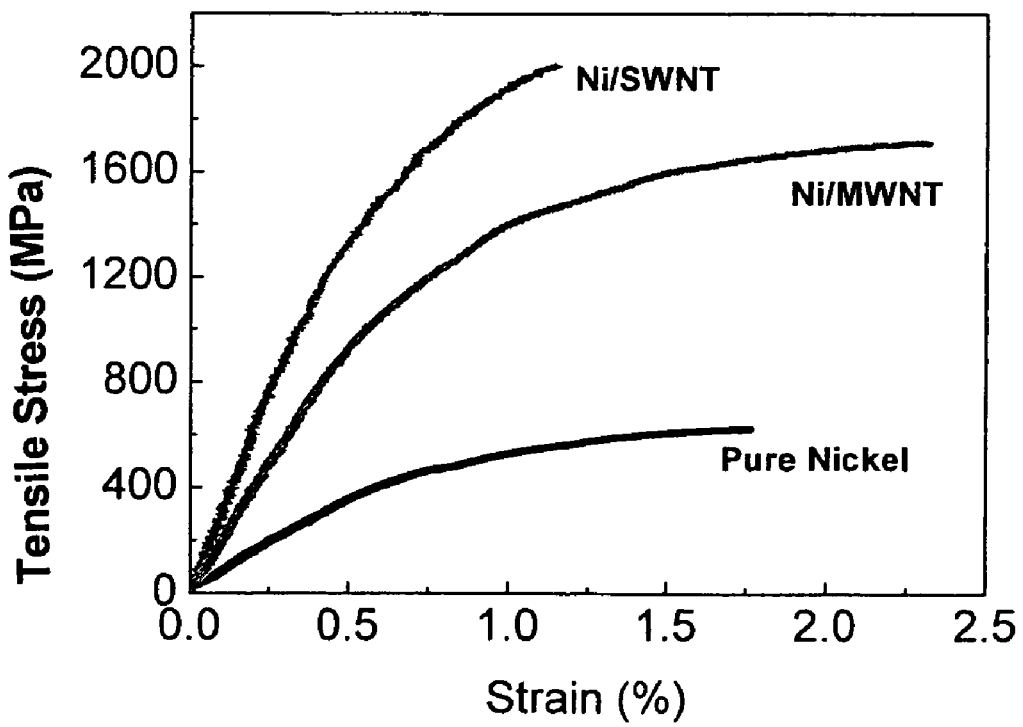
FIG. 8 is plot which compares tensile test results from pure nickel and carbon nanotube reinforced composites according to the invention fabricated using essentially the same electrochemical deposition method. The multi-walled carbon nanotube (MWNT) reinforced nickel composite increased the strength by more than 270% as compared to that of pure nickel, while the SWNT composite increased the strength by more than 320% as compared to pure nickel.

FIG. 8 is plot which compares tensile test results from pure nickel and carbon nanotube reinforced composite fabricated using essentially the same electrodeposition method. The multi-walled carbon nanotube (MWNT) reinforced nickel composite increase the strength by more than 270% that that of pure nickel, while single walled carbon nanotube (SWNT) increased the strength by more than 320% of pure nickel fabricated with similar electrochemical deposition method.

Figure 9:
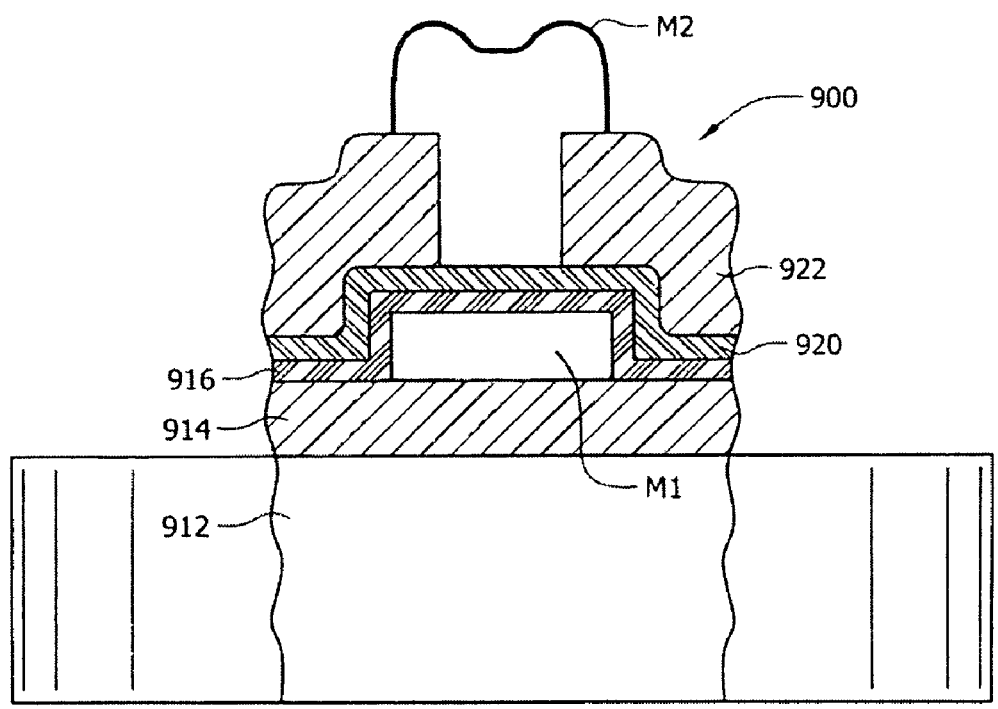
FIG. 9 is a sectional schematic view of a portion of a semiconducting integrated circuit having metal interconnect layers according to the invention.

FIG. 9 is a sectional schematic view of a portion of an intergrated circuit 900 having metal interconnect layers comprising metal nanotube composites according to the invention. As shown in FIG. 9, the intergrated circuit 900 is formed upon a silicon 912. The intergrated circuit 900 further includes a field oxide layer 914 deposited over the substrate, a first metallization layer M1 comprising a metal nanocomposite according to the invention deposited over the field oxide layer, a dielectric layer 916 deposited over the first metal layer M1, and an electrically conductive layer 920 deposited over the dielectric layer 916, an interlevel dielectric material 922 deposited over a portion layer 920, and a second metallization layer M2 comprising a metal nanocomposite according to the invention deposited over the interlevel dielectric material 922. Beneath M1 layer and M2 layer is a metallic seed layer 928 as described in paragraph wich allows electro-codeposition of metal nanocomposite according to the invention on electrically non-conductive or semiconducting materials, such as field oxide layer 914.

While various embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A carbon nanotube reinforced metal nanocomposite material, comprising:
a continuous metal phase comprising copper, and
a plurality of carbon nanotubes uniformly covered by and interfacially bonded to said continuous metal phase, wherein said continuous metal phase extends throughout substantially an entire volume of said nanocomposite material, and
further wherein said nanocomposite material provides a 25° C. bulk electrical conductivity that is at least 20% greater than a 25° C. bulk electrical conductivity of said metal.

2. The nanocomposite material of claim 1, wherein said metal comprises copper and said 25° C. bulk electrical conductivity of said nanocomposite material is at least 40% greater than said 25° C. bulk electrical conductivity of said copper.

3. The nanocomposite material of claim 1, wherein said plurality of carbon nanotubes comprise at least 95% single wall nanotubes (SWNTS).

4. The nanocomposite material of claim 1, further comprising a metallic surface having a composition different from said metal, wherein said nanocomposite material is electroplated onto said metallic surface.

5. The nanocomposite material of claim 1, wherein said nanocomposite material provides coefficient of thermal expansion in the range from 3 to 6×10⁻⁶/K in the temperature range from 25 to 150° C.

6. The nanocomposite material of claim 1, wherein a volume fraction of said plurality of carbon nanotubes is from 5 to 30% of said nanocomposite material.

7. The nanocomposite material of claim 1, wherein said nanocomposite material is a layer having a thickness, wherein said plurality of carbon nanotubes are preferentially aligned in said nanocomposite material in a direction generally orthogonal to a direction of said thickness.

8. The nanocomposite material of claim 1, wherein said 25° C. bulk electrical conductivity and a bulk thermal conductivity of said nanocomposite material are both isotropic.

9. The nanocomposite material of claim 1, wherein said nanocomposite material consists of said continuous metal phase and said plurality of carbon nanotubes.

10. An integrated circuit (IC), comprising,
a semiconducting substrate layer, and
at least one interconnect layer comprising a carbon nanotube reinforced metal nanocomposite material on said semiconducting substrate layer, comprising:
a continuous metal phase comprising copper, and
a plurality of carbon nanotubes uniformly covered by and interfacially bonded to said continuous metal phase, wherein said continuous metal phase extends throughout substantially an entire volume of said nanocomposite,
further wherein said nanocomposite material provides a 25° C. bulk electrical conductivity that is at least 20% greater than a 25° C. bulk electrical conductivity of said metal.

11. The IC of claim 10, wherein said 25° C. bulk electrical conductivity and a bulk thermal conductivity of said nanocomposite material are both isotropic.

12. The IC of claim 10, wherein said metal comprises copper and said 25° C. bulk electrical conductivity of said nanocomposite material is at 40% greater than said 25° C. bulk electrical conductivity of said metal.

13. The IC of claim 10, further comprising further comprising a metallic surface having a composition different from said metal, wherein said nanocomposite material is electroplated onto said metallic surface.

14. The IC of claim 10, wherein said plurality of carbon nanotubes are preferentially aligned in said composite in a direction generally orthogonal to a thickness direction of said interconnect layer.

15. The IC of claim 10, wherein said interconnect layer is formed inside a damascene structure.

16. The IC of claim 15, wherein said at least one interconnect layer comprises a first interconnect layer and a second interconnect layer, further comprising an inter-level dielectric layer between said first interconnect layer and said second interconnect layer, wherein said second interconnect layer includes a vertical portion in a thickness direction of said inter-level dielectric layer and a horizontal lateral portion on top of said inter-level dielectric layer.

17. A carbon nanotube reinforced metal nanocomposite material formed by an electro-codeposition process, comprising:
a continuous metal phase comprising copper, and
a plurality of carbon nanotubes uniformly covered by and interfacially bonded to said continuous metal phase, wherein said continuous metal phase extends throughout substantially an entire volume of said nanocomposite,
wherein said nanocomposite material provides a 25° C. bulk electrical conductivity that is at least 20% greater than a 25° C. bulk electrical conductivity of said metal, and
wherein said electrodeposition process includes a power supply connected between an anode and a cathode for codeposition of both said metal and said plurality of carbon nanotubes onto said cathode.

18. The nanocomposite material of claim 17, wherein said plurality of carbon nanotubes are pretreated with one or more surfactants, and a pH value during said electro-codeposition process is maintained at a level of 2-5.

* * * * *